(12) United States Patent
Yang et al.

(10) Patent No.: US 9,991,004 B2
(45) Date of Patent: Jun. 5, 2018

(54) SHIFT REGISTER UNIT AND DRIVING METHOD THEREOF, SCAN DRIVING CIRCUIT AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Dong Yang, Beijing (CN); Xi Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 149 days.

(21) Appl. No.: 14/907,993

(22) PCT Filed: Sep. 16, 2015

(86) PCT No.: PCT/CN2015/089724
§ 371 (c)(1),
(2) Date: Jan. 27, 2016

(87) PCT Pub. No.: WO2016/161770
PCT Pub. Date: Oct. 13, 2016

(65) Prior Publication Data
US 2016/0300623 A1    Oct. 13, 2016

(30) Foreign Application Priority Data
Apr. 10, 2015  (CN) .......................... 2015 1 0169597

(51) Int. Cl.
*G11C 19/00*    (2006.01)
*G11C 19/28*    (2006.01)
(Continued)

(52) U.S. Cl.
CPC ............. *G11C 19/28* (2013.01); *G09G 5/003* (2013.01); *G09G 3/3677* (2013.01);
(Continued)

(58) Field of Classification Search
None
See application file for complete search history.

(56) References Cited

U.S. PATENT DOCUMENTS

2008/0101529 A1 * 5/2008 Tobita .................. G09G 3/3677
377/64
2008/0116944 A1 * 5/2008 Tobita .................... G11C 19/28
327/142
(Continued)

OTHER PUBLICATIONS

International Preliminary Report on Patentability dated Oct. 10, 2017.

*Primary Examiner* — Tuan T Lam
(74) *Attorney, Agent, or Firm* — Dilworth & Barrese, LLP.; Michael J. Musella, Esq.

(57) ABSTRACT

A shift register unit and a driving method thereof, a scan driving circuit and a display device, wherein the shift register unit comprises an input terminal (INPUT), an output terminal (OUTPUT), a reset terminal (RESET), and a first noise leak terminal (LEAK1), and further comprises an output pull-down module (14), and also an input module (11), an output module (12), a reset module (13) and a first noise leak module (15) that are connected to a first node (PU), the input module (11) being configured to pull up a voltage at the first node (PU) under control of a signal received at the input terminal (INPUT), the first noise leak module (15) being configured to release a noise voltage at the first node (PU) to the first noise leak terminal (LEAK1) under control of a third clock signal (CLK1), and to disconnect an electrical connection between the first noise leak terminal (CLK1) and the first node (PU) during a time period
(Continued)

in which the voltage at the first node (PU) is pulled up, by which a stable output of the GOA unit with noise interference being eliminated can be achieved with relatively few circuit elements.

20 Claims, 5 Drawing Sheets

(51) Int. Cl.
    *G09G 5/00*     (2006.01)
    *G09G 3/36*     (2006.01)
(52) U.S. Cl.
    CPC .......... *G09G 2310/0286* (2013.01); *G09G 2310/0289* (2013.01); *G09G 2310/061* (2013.01); *G09G 2310/08* (2013.01); *G09G 2320/0257* (2013.01); *G09G 2330/021* (2013.01)

(56) References Cited

U.S. PATENT DOCUMENTS

| | | | |
|---|---|---|---|
| 2008/0219401 A1* | 9/2008 | Tobita | G09G 3/3677 377/79 |
| 2012/0008731 A1* | 1/2012 | Hsu | G11C 19/28 377/79 |
| 2013/0016804 A1* | 1/2013 | Ahn | G11C 19/28 377/64 |
| 2013/0335665 A1* | 12/2013 | Tseng | G02F 1/13306 349/43 |
| 2014/0049712 A1* | 2/2014 | Yu | G02F 1/13306 349/34 |
| 2014/0055333 A1* | 2/2014 | Lin | G09G 3/3611 345/100 |
| 2016/0253975 A1* | 9/2016 | Yang | G11C 19/28 345/58 |

* cited by examiner

SHIFT REGISTER UNIT AND DRIVING METHOD THEREOF, SCAN DRIVING CIRCUIT AND DISPLAY DEVICE

TECHNICAL FIELD

The present disclosure relates to a shift register unit and a driving method thereof, a scan driving circuit and a display device.

BACKGROUND

Compared to traditional technology, GOA (Gate Drive on Array, an array substrate row driving technology) not only saves cost, but also can achieve an aesthetic design of symmetry of both sides of a display panel, and also leave out binding area for a chip as well as for example wiring area for a fan-out region, which facilitates effectuation of a narrow border design. Meanwhile, since chip binding process in a row direction can be omitted, it is advantageous to enhance the overall production capacity and yield.

However, GOA also has some problems in practical applications. For example, in order to achieve a stable output of scan signal in each row and prevent noise interference from causing erroneous output, it often needs to set a number of additional circuit elements in the GOA unit of each row, so that the number of circuit elements in each GOA unit may be more than ten, this severely restricts control of product cost and reduction in power consumption. Therefore, how to use as few circuit elements as possible to achieve a stable output of the GOA unit with noise interference being eliminated, has become an urgent problem that needs to be solved in the art.

SUMMARY

The present disclosure provides a shift register unit and a driving method thereof, a scan driving circuit and a display device, which can achieve a stable output of the GOA unit with noise interference being eliminated, by means of using as relatively few circuit elements.

In a first aspect, the present disclosure provides a shift register unit, comprising an input terminal, an output terminal, a reset terminal, and a first noise leak terminal. The shift register unit further comprises:

an input module connected to the input terminal and a first node, and configured to pull up a voltage at the first node under control of a signal received at the input terminal;

an output module connected to the output terminal and the first node, and configured to pull up a voltage at the output terminal by using a first clock signal under control of the voltage at the first node;

a reset module connected to the reset terminal and the first node, and configured to pull down the voltage at the first node under control of a signal received at the reset terminal;

an output pull-down module connected to the output terminal, and configured to pull down the voltage at the output terminal under control of a second clock signal; and a first noise leak module connected to the first noise leak terminal and the first node, and configured to release a noise voltage at the first node to the first noise leak terminal under control of a third clock signal;

wherein the first noise leak module is further configured to disconnect an electrical connection between the first noise leak terminal and the first node during a time period in which the voltage at the first node is pulled up.

Optionally, the first noise leak module comprises a first transistor, a gate of the first transistor being connected to the third clock signal, one of a source and a drain of the first transistor being connected to the first noise leak terminal, and the other of the source of and the drain of the first transistor being connected to the first node; and during at least a part of the time period in which the voltage at the first node is pulled up, a voltage of a signal received at the first noise leak terminal is greater than or equal to a voltage of the third clock signal.

Optionally, the shift register unit further comprises a second noise leak terminal, and a second noise leak module connected to the first node;

the second noise leak module is further connected to the second noise leak terminal, and is configured to release a noise voltage at the first node to the second noise leak terminal under control of a fourth clock signal;

wherein the second noise leak module is further configured to disconnect an electrical connection between the second noise leak terminal and the first node during a time period in which the voltage at the first node is pulled up.

Optionally, the second noise leak module comprises a second transistor, a gate of the second transistor being connected to the fourth clock signal, one of a source and a drain of the second transistor being connected to the second noise leak terminal, and the other of the source and the drain of the second transistor being connected to the first node; and during at least a part of the time period in which the voltage at the first node is pulled up, a voltage of a signal received at the second noise leak terminal is greater than or equal to a voltage of the fourth clock signal.

Optionally, phases of the third clock signal, the first clock signal, the fourth clock signal, and the second clock signal lag sequentially within a single clock cycle of the shift register unit.

Optionally, the output module comprises:

a first capacitor, a first terminal thereof being connected to the first node; and a third transistor, a gate thereof being connected to the first node, one of a source and a drain thereof being connected to the first clock signal, and the other of the source and the drain thereof being connected to the output terminal.

Optionally, the output pull-down module comprises a fourth transistor, a gate of the fourth transistor being connected to the second clock signal, one of a source and a drain of the fourth transistor being connected to the output terminal, and the other of the source and the drain of the fourth transistor being connected to a low level voltage line.

Optionally, the input module comprises a fifth transistor, a gate of the fifth transistor being connected to the input terminal, one of a source and a drain of the fifth transistor being connected to a high level voltage line, and the other of the source and the drain of the fifth transistor being connected to the first node.

Optionally, the reset module comprises a sixth transistor, a gate of the sixth transistor being connected to the reset terminal, one of a source and a drain of the sixth transistor being connected to the first node, and the other of the source and the drain of the sixth transistor being connected to a low level voltage line.

In a second aspect, the present disclosure also provides a driving method for a shift register unit, the shift register unit including an input terminal, an output terminal, a reset terminal, a first noise leak terminal, and also a first node located inside the shift register unit. The driving method comprises:

pulling up a voltage at the first node under control of a signal received at the input terminal;

pulling up a voltage at the output terminal by using a first clock signal under control of a voltage at the first node, and disconnecting an electrical connection between the first noise leak terminal and the first node during a time period in which the voltage at the first node is pulled up;

pulling down the voltage at the first node under control a signal received at the reset terminal, and pulling down the voltage at the output terminal under control of a second clock signal; and controlling a noise voltage at the first node to be released to the first noise leak terminal under control of the third clock signal.

In a third aspect, the present disclosure also provides a scan driving circuit comprising multiple stages of any of the shift register units described above, wherein an input terminal of the shift register unit at an N-th stage is connected to an output terminal of the shift register unit at an (N−2)-th stage, a first noise leak terminal of the shift register unit at the N-th stage is connected to an output terminal of the shift register unit at the (N−1)-th stage, and a reset terminal of the shift register unit at the N-th stage is connected to an output terminal of the shift register unit at the (N+2)-th stage, the N being greater than or equal to 3.

Optionally, the shift register unit further comprises a second noise leak terminal, wherein a second noise leak terminal of the shift register unit at the N-th stage is connected to an output terminal of the shift register unit at the (N+1)-th stage.

In a fourth aspect, the present disclosure also provides a display device comprising any of the scan driving circuits described above.

Accordingly, the present disclosure can, based on a setting of the noise leak terminal and the noise leak module in the shift register unit, periodically perform noise leaking on the first node by using a clock signal, so as to eliminate noise interference suffered by the shift register unit; meanwhile, the noise leak module can avoid by a certain setting a time period during which a potential at the first node of the shift register unit at the present stage is pulled up, and thus can ensure a stable output of signal at the output terminal. Also, the functions of the noise leak module can be implemented by one transistor to the least, so that the present disclosure can use relatively few circuit elements to achieve a stable output of the GOA unit with noise interference being eliminated, which facilitates reducing the cost and power consumption of a product.

DETAILED DESCRIPTION OF THE EMBODIMENTS

To make the objects, technical solutions, and advantages of the present disclosure clearer and more obvious, hereinafter, the technical solutions in the embodiments of the present disclosure will be described clearly and comprehensively in combination with the drawings. Obviously, these described embodiments are parts of the embodiments of the present disclosure, rather than all of the embodiments thereof. All the other embodiments obtained by those of ordinary skill in the art based on the embodiments of the present disclosure without paying inventive works fall into the protection scope of the present disclosure.

Figure 1:
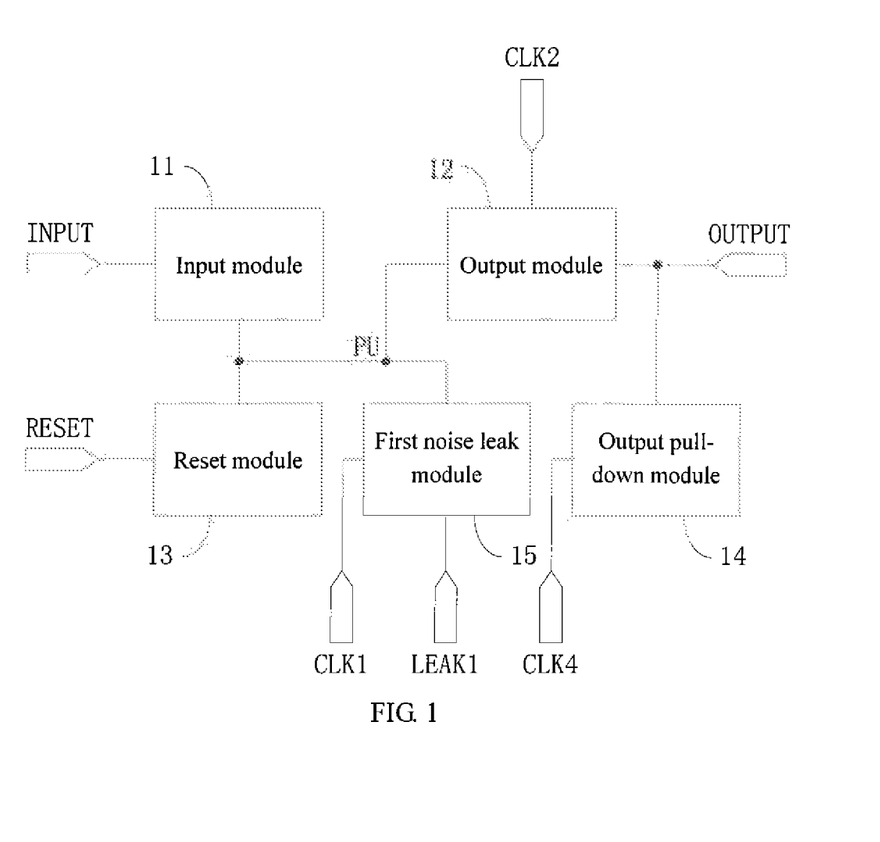
FIG. 1 is a block diagram of structure of a shift register unit in an embodiment of the present disclosure.

FIG. 1 is a block diagram of structure of a shift register unit in an embodiment of the present disclosure. Referring to FIG. 1, the shift register unit comprises an input terminal INPUT, an output terminal OUTPUT, a reset terminal RESET, and a first noise leak terminal LEAK1, and further comprises an output pull-down module 14, and also an input module 11, an output module 12, a reset module 13 and a first noise leak module 15 that are connected to a first node PU, wherein:

the input module 11 is also connected to the input terminal INPUT, and is configured to pull up a voltage at the first node PU under control of a signal received at the input terminal INPUT;

the output module 12 is also connected to the output terminal OUTPUT, and is configured to pull up a voltage at the output terminal OUTPUT by using a first clock signal CLK2 under control of the voltage at the first node PU;

the reset module 13 is also connected to the reset terminal RESET, and is configured to pull down the voltage at the first node PU under control of a signal received at the reset terminal RESET;

the output pull-down module 14 is connected to the output terminal OUTPUT, and is configured to pull down the voltage at the output terminal OUTPUT under control of a second clock signal CLK4;

the first noise leak module 15 is also connected to the first noise leak terminal LEAK1, and is configured to release a noise voltage at the first node PU to the first noise leak terminal LEAK1 under control of a third clock signal CLK1;

the first noise leak module 15 is further configured to disconnect an electrical connection between the first noise leak terminal CLK1 and the first node PU during a time period in which the voltage at the first node PU is pulled up.

Based on the above configuration, when the input terminal INPUT receives a pulse signal, the input module 11 pulls up the voltage at the first node PU, thereby the voltage at the first node PU controls the output module 12 to pull up the voltage at the output terminal OUTPUT, thus completing shift output of the pulse signal by the shift register unit. When the reset terminal RESET receives the pulse signal, the reset module 13 pulls down the voltage at the first node PU, so that the output module 11 stops operating; at the same time, the second clock signal CLK4 can control the output pull-down block 14 to pull down the potential at the output terminal OUTPUT, thus completing reset of the shift register unit.

During a time period in which the voltage at the first node PU is pulled up, the first noise leak module 15 disconnects the electrical connection between the first noise leak terminal LEAK1 and the first node PU, so that the first noise leak module 15 will not affect shift output of the above pulse signal by the shift register unit; whereas during the other time periods, the third clock signal CLK1 can periodically control the first noise leak module 15 to release the noise voltage at the first node PU to the first noise leak terminal LEAK1, so as to eliminate the noise interference suffered by the shift register unit.

Accordingly, the embodiment of the present disclosure can, based on a setting of the noise leak terminal and the noise leak module in the shift register unit, periodically perform noise leaking on the first node by using a clock signal, so as to eliminate noise interference suffered by the shift register unit; meanwhile, the noise leak module can avoid by a certain setting a time period during which a potential at the first node of the shift register unit at the present stage is pulled up, and thus can ensure a stable output of signal at the output terminal. Also, the functions of the noise leak module can be implemented by one transistor to the least, so that the embodiment of the present disclosure can use relatively few circuit elements to achieve a stable output of the GOA unit with noise interference being eliminated, which facilitates reducing cost and power consumption of a product.

It should be noted that the input terminal INPUT, output terminal OUTPUT, reset terminal RESET and first noise leak terminal LEAK1 comprised in the above shift register unit may be either actual circuit connecting members or virtual circuit nodes in the circuit structure, which can be selected by those skilled in the art according to an application scenario, to which the present disclosure makes no limitations.

It should be further noted that the above wording of " . . . (perform some action) under control of . . . (a certain signal)" refers to selecting, according to a state of a certain signal in a certain instant, whether to execute a certain action at this instant. For example, "the input module 11 is configured to pull up a voltage at the first node PU under control of a signal received at the input terminal INPUT" may be understood as "the input module 11 is configured to select, according to a state of a signal received at the input terminal INPUT at a certain instant, whether to pull up a voltage at the first node PU at this instant". As an example, the input module 11 may include a switch element controlled by an electrical signal, a control terminal of the switch element being connected to the input terminal INPUT, a first terminal thereof being connected to a high level voltage line, and a second terminal thereof being connected to the first node PU, wherein the switch element is configured to establish or disconnect an electrical connection between the first terminal and the second terminal under control of a signal received at the control terminal. The switch element may, for example, be a relay, a transistor, and the like.

In addition, it should be noted that, in an embodiment of the present disclosure, the first to third clock signals mentioned above refer to clocks signals having the same frequency, but different phases in the same clock cycle. For the convenience of description, the above-mentioned clock cycle is prescribed herein as a time period starting from a certain instant at which the third clock signal turns from a low level to a high level, and ending at a next instant at which the third clock signal turns from a low level to a high level. Introducing the above three clock signals indicates that the shift register unit may operate with a three-phase clock signal. Of course, based on a similar configuration, the shift register unit may also operate with circuit timing such as a four-phase clock signal, an eight-phase clock signal or other multi-phase clock signal.

Figure 2:
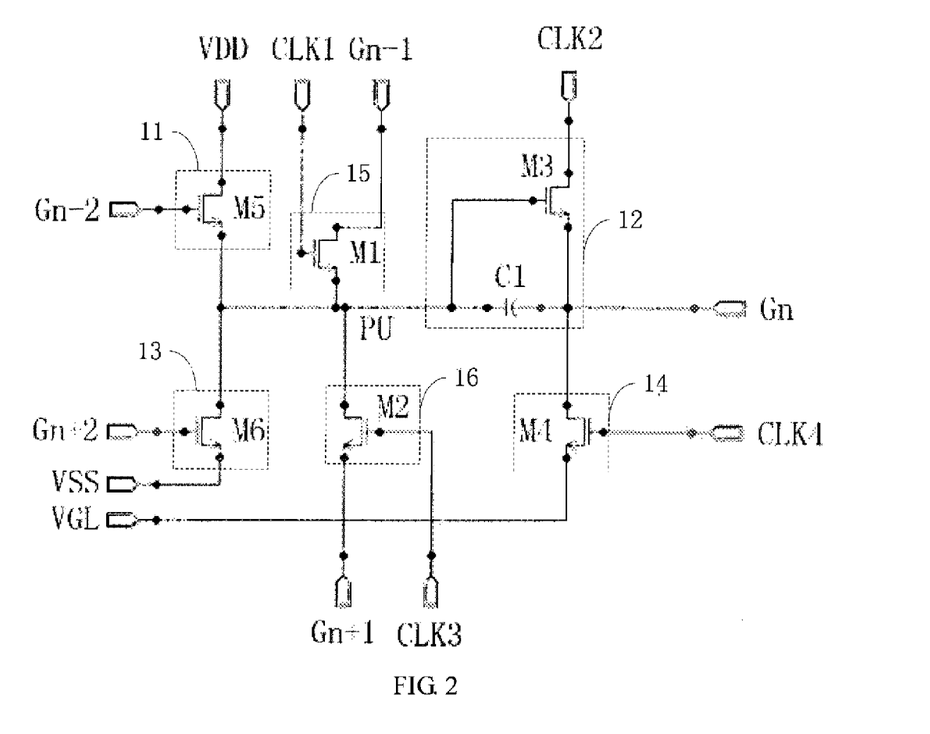
FIG. 2 is a schematic diagram of circuit structure of a shift register unit in an embodiment of the present disclosure.

FIG. 2 is a schematic diagram of circuit structure of a shift register unit in an embodiment of the present disclosure.

In a first aspect, the shift register unit comprises a second noise leak terminal (denoted by a signal Gn+1 received at the second noise leak terminal in FIG. 2) and a second noise leak module 16 connected to the first node PU. The second noise leak module 16 is also connected to the second noise leak terminal, and is configured to release a noise voltage at the first node PU to the second noise leak terminal under control of a fourth clock signal CLK3. The second noise leak module 16 is further configured to disconnect an electrical connection between the second noise leak terminal and the first node PU during a time period in which the voltage at the first node PU is pulled up. In addition, the shift register unit may also be provided with a second leak noise module having similar structures and functions to those of the first leak noise module (or it may be provided with more noise leak modules), and perform a noise leaking on the first node PU under control of a different clock signal respectively, so as to further reduce a noise voltage at the first node PU.

In a second aspect, in the circuit structure of the shift register unit, the first noise leak module 15 comprises a first transistor M1, a gate of the first transistor M1 being connected to the third clock signal CLK1, one of a source and a drain of the first transistor being connected to the first noise leak terminal LEAK1 (denoted by a signal Gn−1 received at the first noise leak terminal in FIG. 2), and the other of the source of and the drain of the first transistor being connected to the first node PU, wherein, during at least a part of the time period during which the voltage at the first node PU is pulled up, a voltage of a signal Gn−1 received at the first noise leak terminal is greater than or equal to a voltage of the third clock signal CLK1. Based on this, during at least a part of the time period in which the voltage at the first node PU is pulled up, a gate voltage of the first transistor M1 is less than or equal to a source voltage and a drain voltage, thus operating in the cutoff region, no current passing through the source and the drain, so that the first noise leak module 15 will not affect shift output of the signal received at the output terminal performed by the shift register unit. In any other time periods, the first transistor M1 can periodically make the first node PU and the signal received at the first noise leak terminal LEAK1 into conduction according to the third clock signal CLK1, so that the noise voltage at the first node PU can be released to the first noise leak terminal LEAK1. As can be seen, the functions of the noise leak module 15 can be implemented by one transistor, and noise interference suffered by the shift register unit can be eliminated and stable output of signals at the output terminal can be ensured.

Similarly, in FIG. 2, the second noise leak module 16 comprises a second transistor M2, a gate of the second transistor M2 being connected to the fourth clock signal CLK3, one of a source and a drain of the second transistor M2 being connected to the second noise leak terminal (denoted by a signal Gn+1 received at the second noise leak terminal in FIG. 2), and the other of the source and the drain of the second transistor being connected to the first node PU, wherein, during at least a part of the time period in which the voltage at the first node PU is pulled up, a voltage of a signal Gn+1 received at the second noise leak terminal is greater than or equal to a voltage of the fourth clock signal CLK3. Based on this, the second noise leak module 16 will also not affect shift output of the signal received at the output terminal performed by the shift register unit, and can also release the noise voltage at the first node PU to the second noise leak terminal. Similarly, the functions of the second noise leak module 16 can also be implemented by one transistor, and noise interference suffered by the shift register unit can be further eliminated and stable output of signals at the output terminal can be ensured.

In a third aspect, in FIG. 2, the output module 12 comprises a first capacitor C1 and a third transistor M3, wherein a first terminal of the first capacitor is connected to the first node PU; a gate of the third transistor is connected to the first node PU, one of a source and a drain thereof is connected to the first clock signal CLK2, and the other of the source and the drain thereof is connected to the output terminal OUTPUT (denoted by the signal Gn at the output terminal in FIG. 2). Based on this, after the voltage at the first node PU is pulled up by the input module 11, the first capacitor C1 stores a voltage applied across both ends (at this time, the first clock signal CLK2 is a low level); after the first clock signal CLK2 turns to a high level, a voltage difference between the voltage at the first node PU and the voltage of the first clock signal CLK2 is still maintained by the first capacitor C1, so that the voltage at the first node PU further increases, meanwhile the output terminal OUTPUT is pulled up by the first clock signal at this time via the third transistor M3, and the shift register unit outputs a high level. As can be seen, the functions of the output module 12 may be implemented by a circuit structure comprising one capacitor and one transistor.

In a fourth aspect, in FIG. 2, the output pull-down module 14 comprises a fourth transistor M4, a gate of the fourth transistor M4 being connected to the second clock signal CLK4, one of a source and a drain thereof being connected to the output terminal OUTPUT (denoted by the signal Gn at the output terminal in FIG. 2), and the other of the source and the drain thereof being connected to a low level voltage line VGL. Based on this, the second clock signal CLK4 may periodically turn on the fourth transistor M4, so that the output terminal OUTPUT and the low level voltage line VGL are conductive periodically, thus implementing pull-down of the voltage at the output terminal OUTPUT. As can be seen, the functions of the above output pull-down module 14 can be implemented by a circuit structure comprising one transistor.

In a fifth aspect, in FIG. 2, the input module 11 comprises a fifth transistor M5, a gate of the fifth transistor M5 being connected to the input terminal INPUT (denoted by a signal Gn-2 received at the input terminal in FIG. 2), one of a source and a drain thereof being connected to a high level voltage line VDD, and the other of the source and the drain thereof being connected to the first node PU. Based on this, the fifth transistor M5 may be the turned on under control of the signal Gn-2 received at the input terminal, so that the high level voltage line VDD pulls up the voltage at the first node PU via the source and the drain of the fifth transistor M5. As can be seen, the functions of the above input module 11 can be implemented by a circuit structure comprising one transistor.

In a sixth aspect, in FIG. 2, the reset module 13 comprises a sixth transistor M6, a gate of the sixth transistor M6 being connected to the reset terminal RESET (denoted by a signal Gn+2 received at the reset terminal in FIG. 2), one of a source and a drain thereof being connected to the first node PU, and the other of the source and the drain thereof being connected to a low level voltage line VSS. Based on this, the fifth transistor M5 may be turned on under control of the signal Gn+2 received at the reset terminal, so that the low level voltage line VSS pulls down the voltage at the first node PU via the source and the drain of the sixth transistor M6. As can be seen, the functions of the reset function module 13 can be implemented by a circuit structure comprising one transistor.

Figure 3:
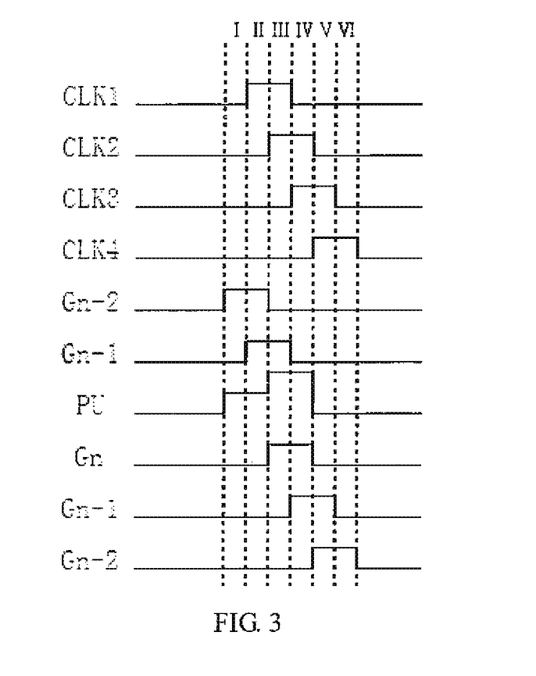
FIG. 3 is a circuit timing diagram of the circuit structures as shown in FIG. 2 within one clock cycle.

Corresponding to all of the circuit structures shown in FIG. 2, FIG. 3 is a circuit timing diagram of the circuit structures as shown in FIG. 2 within one clock cycle. Referring to FIG. 3, within a single clock cycle of the shift register unit, phases of the third clock signal CLK1, the first clock signal CLK2, the fourth clock signal CLK3, and the second clock signal CLK4 lag sequentially. Based on this, this shift register unit can use relatively few circuit elements to achieve a stable output of the GOA unit with noise interference being eliminated, in which:

in stages I and II, Gn-2 is a high level, so that M5 is turned on, and the voltage at PU is pulled up by VDD; in stages II and III, CLK1 and Gn-1 are high levels, so that the gate voltage of M1 is less than or equal to the source voltage and the drain voltage thereof, M1 is in a turned-off state, and the voltage at the first node PU will not leak to Gn-1 via M1; in stages III and IV, Gn-2 turns to a low level, M5 is turned off, and C1 stores the voltage difference between the voltage at PU and the voltage of CLK2 in stages I and II, the voltage at PU is thus further pulled up after CLK2 turned to a high level, and meanwhile M3 is turned on, the high level at CLK2 pulls up the voltage of Gn via M3, the shift register unit outputs a high level at the output terminal, equivalent to shifting backwards a width of a clock pulse with respect to the signal Gn-2 received at the input terminal, i.e., achieving a shift output of the signal received at the input terminal; in stages IV and V, CLK3 and Gn+1 are high levels, so that the gate voltage of M2 is less than or equal to the source voltage and the drain voltage thereof, M2 is turned off, and the voltage at the first node PU will not leak to Gn+1 via M2; in stages V and VI, CLK4 and Gn+2 are high levels, M4 and M6 are turned on, the voltage at PU is pulled down by VSS via M6, the signal Gn received at the output terminal is pulled down by VGL via M4, so that the shift register unit is reset to an non-operating state; and during other time periods except the above respective stages, CLK1 and CLK3 will periodically turn on M1 and M2, so that a noise voltage, which still possibly exists at PU after being pulled down, may be released to Gn-1 and Gn+1 via M1 and M2, respectively, to maintain the stability of the potential at PU and to prevent an erroneous output of the shift register unit during the non-operating time period.

As can be seen, structures of the input module 11 and the reset module 13 described above are symmetrical, and therefore can be interchanged with each other; structures of the first noise leak module 15 and the second noise leak module 16 are also symmetrical, and can also be interchanged with each other. Accordingly, by changing the phases of the third clock signal CLK1, first clock signal CLK2, fourth clock signal CLK3, and second clock signal CLK4 to advance sequentially, and interchanging Gn-2 and Gn+2 with each other, interchanging VSS and VDD, and interchanging Gn-1 and Gn+1, it is possible to implement a shift output of the shift register unit via the same operating flows. Based on this, the circuit of the shift register circuit unit shown in FIG. 2 can cooperate with the circuit timing shown in FIG. 3, to implement the function of a bi-directional shift output with a four-phase clock signal.

Of course, based on a similar configuration, it is also possible to obtain a bi-directional shift register unit operating with other multi-phase clock signals, to which the present disclosure makes no limitations.

Figure 4:
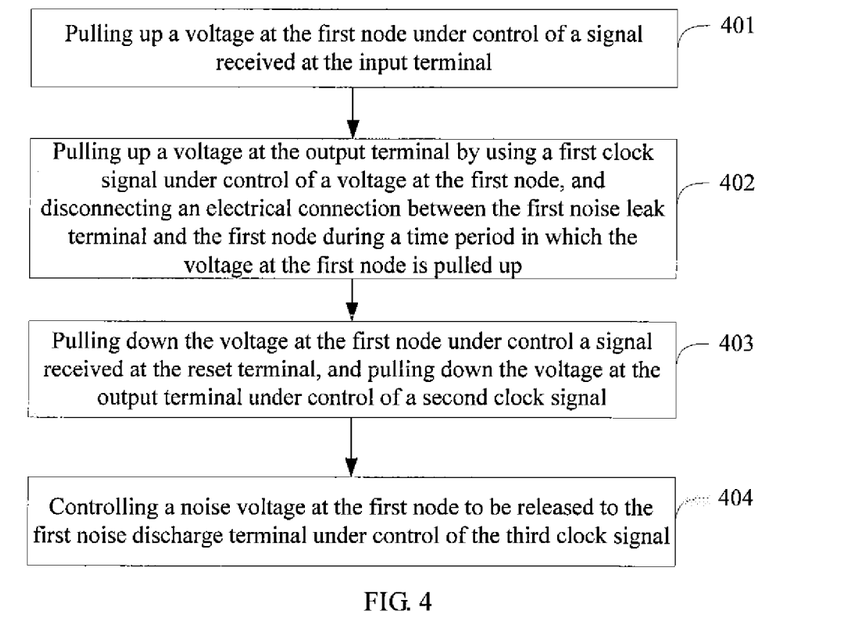
FIG. 4 is a schematic flow diagram of the steps of a driving method for a shift register unit in an embodiment of the present disclosure.

Based on the same concept, the present disclosure provides a driving method for a shift register unit. The shift register unit includes an input terminal, an output terminal, a reset terminal, a first noise leak terminal, and also a first node located inside the shift register unit. FIG. 4 is a schematic flow diagram of the steps of a driving method for a shift register unit in an embodiment of the present disclosure. Referring to FIG. 4, the method comprises:

step 401, pulling up a voltage at the first node under control of a signal received at the input terminal;

step 402, pulling up a voltage at the output terminal by using a first clock signal under control of a voltage at the first node, and disconnecting an electrical connection between the first noise leak terminal and the first node during a time period in which the voltage at the first node is pulled up;

step 403, pulling down the voltage at the first node under control a signal received at the reset terminal, and pulling down the voltage at the output terminal under control of a second clock signal; and step 404, releasing a noise voltage at the first node to the first noise leak terminal under control of the third clock signal.

As can be seen, the circuit timing based on the circuit structure of the shift register unit as shown in FIGS. 2 and 3 is also an example of the above steps 401 to 404, no more details repeated here. It needs to be noted that, a sequence of executing the above steps 401 to 404 is associated with timing relationship among the first to third clock signals, and therefore there is no absolute precedence and subsequence. Furthermore, when the above shift register unit further comprises a second noise leak terminal, the above method may further comprise the following steps not shown in FIG. 4 (there may be no limitations the executing sequence):

step 402*a*, disconnecting an electrical connection between the second noise leak terminal and the first node during a time period in which the voltage at the first node is pulled up; and step 405, releasing the noise voltage at the first node to the second noise leak terminal under the control of the fourth clock signal.

Accordingly, the functions of the shift register with a multi-phase clock signal can be achieved, and relatively few circuit elements can be used to achieve a stable output of the GOA unit with noise interference being eliminated.

Figure 5:
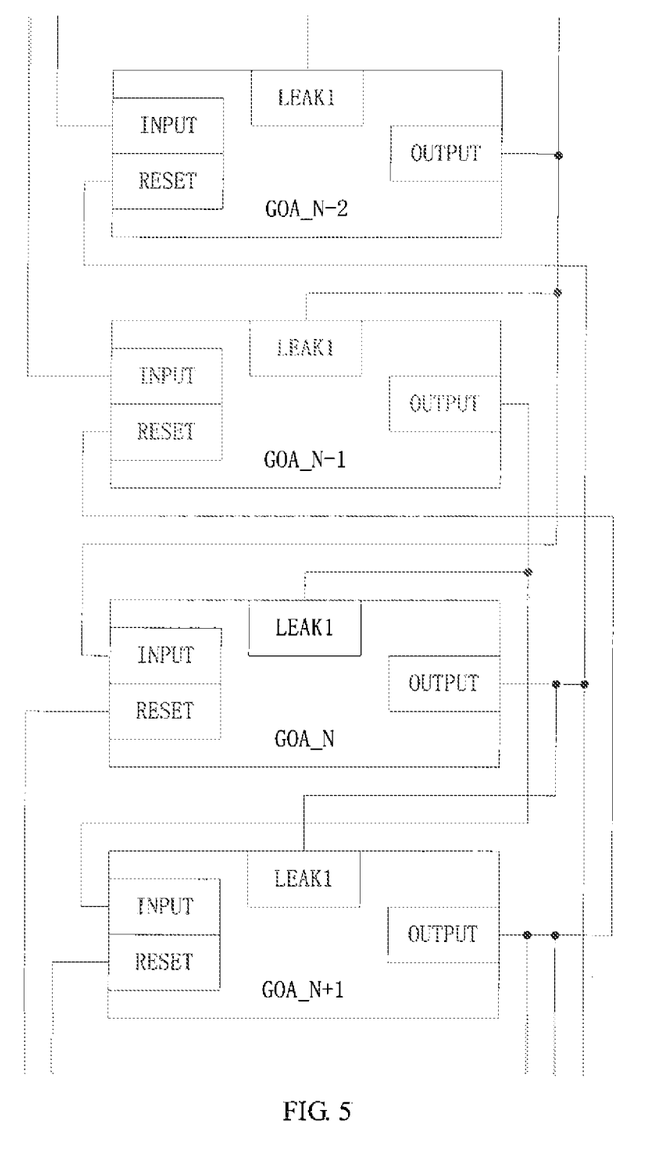
FIG. 5 is a schematic diagram of configuration of a scan driving circuit in an embodiment of the present disclosure.

Further, based on the same concept, an embodiment of the present disclosure provides a scan driving circuit, the scan driving circuit comprising any of the shift register units described above. FIG. 5 is a schematic diagram of configuration of a scan driving circuit in an embodiment of the present disclosure.

Referring to FIG. 5, for an arbitrary N that is greater than or equal to 3, an input terminal INPUT of the shift register unit GOA_N at an N-th stage is connected to an output terminal OUTPUT of the shift register unit GOA_N−2 at an (N−2)-th stage, a first noise leak terminal LEAK1 of the shift register unit GOA_N at the N-th stage is connected to an output terminal OUTPUT of the shift register unit GOA_N−1 at the (N−1)-th stage, and a reset terminal RESET of the shift register unit GOA_N at the N-th stage is connected to an output terminal OUTPUT of the shift register unit GOA_N+2 at the (N+2)-th stage (not shown).

Further, not shown in FIG. 5, when the shift register unit further comprises a second noise leak terminal, the second noise leak terminal of the shift register unit GOA_N at the N-th stage is connected to an output terminal OUTPUT of the shift register unit GOA_N+1 at the (N+1)-th stage.

Based on the above configuration, the shift register unit circuit shown in FIG. 2 is combined with the circuit timing shown in FIG. 3, wherein the shift register units at the even-numbered stages form a group of shift registers operating under one pair of clock signals, the shift register units at the odd-numbered stages form a group of shift registers operating under another pair of clock signals, and signals transmitted by the two groups of shift registers differ in phase by a width of half clock pulse. As can be seen, the scan driving circuit can implement a bidirectional scanning with a four-phase clock signal.

Taking the first noise leak terminal LEAK1 as an example, the noise voltage at the first node within the shift register unit can be periodically released to the output terminal OUTPUT of the shift register unit GOA_N−1 at the (N−1)-th stage by the shift register unit GOA_N at the N-th stage under control of a third clock signal, and is pulled down by the output pull-down module 14 of the shift register unit GOA_N−1 at the (N−1)-th stage under the action of the second clock signal within the same clock cycle, so as to achieving the noise voltage releasing at the first node in the shift register unit GOA_N at the N-th stage. Similarly, the shift register unit at the other stages can also achieve the releasing of the noise voltage at the first node based on the same principle. For the second noise leak terminal, the process is also similar, wherein the noise voltage releasing at the first node in the shift register unit GOA_N at the N-th stage can be implemented through the output terminal OUTPUT of the shift register unit GOA_N+1 at the (N+1)-th stage and the output pull-down module 14 thereof. Moreover, in the circuit timing of the third clock signal CLK1, the first clock signal CLK2, the fourth clock signal CLK3, and the second clock signal CLK4 as shown in FIG. 3, the signal received at the output terminal of the shift register unit GOA_N+1 at the (N+1)-th stage may have the same waveform with Gn+1 and CLK3 in FIG. 3, and meanwhile, the signal received at the output terminal of the shift register unit GOA_N−1 at the (N−1)-th stage may have the same waveform with Gn−1 and CLK1 in FIG. 3. Accordingly, based on the same reasons with the foregoing, the first noise leak module 15 and the second noise leak module 16 in the shift register unit GOA_N at the N-th stage will not affect the voltage at the first node PU during a time period in which the voltage at the first node PU is pulled up, and therefore will not affect normal output of the signal at the output OUTPUT in the shift register unit GOA_N at the N-th stage.

Accordingly, the embodiment of the present disclosure can, based on a setting of the noise leak terminal and the noise leak module in the shift register unit, periodically perform noise leaking on the first node by using a clock signal, so as to eliminate noise interference suffered by the shift register unit; meanwhile, the noise leak module can avoid by a certain setting a time period during which a potential at the first node of the shift register unit at the present stage is pulled up, and thus can ensure a stable output of signal at the output terminal. Also, the functions of the noise leak module can be implemented by one transistor to the least, so that the embodiment of the present disclosure can use relatively few circuit elements to achieve a stable output of the GOA unit with noise interference being eliminated, which facilitates reducing the cost and power consumption of a product.

Based on the same concept, an embodiment of the present disclosure provides a display device, comprising any of the scan driving circuits described above. It should be noted that the display device in the embodiment may be any product or component having a display function, such as display panel, electronic paper, mobile phone, tablet, television, laptop, digital photo frame and navigation system. Since the display device comprises any of the scan driving circuits described above, it can solve the same technical problems, and achieve the same technical effects.

In the description of the present disclosure, it should be noted that the orientation or position relationships indicated by the terms "above", "under" etc. are orientation or position shown based on the drawings, which are only to facilitate describing the present disclosure and simplifying the description, rather than to indicate or imply that the device or element referred to must have a particular orientation, or must be constructed or operated with a particular orientation, and therefore cannot be construed as limiting the present disclosure. Unless otherwise expressly specified and limited, the terms of "installation", "connected", "connection" should be broadly understood. For example, it may be a fixed connection, or an attachable connection, or an integral connection; it may also be a mechanical connection, or an electrical connection; it may also be a direct connection, or an indirect connection through an middleware, or a connection inside two components. For those of ordinary skill in the art, the meaning of the aforesaid terms in the present disclosure can be understood according to practice.

It should be also noted that, in the specification, the relationship terms such as "first", "second" and so on are used only to differentiate one entity or operation from another entity or operation, not necessarily requiring or implying that these entities or operations have any of such actual relationships or sequences. And the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment. In the case where there is no further limitation, elements defined by the expressions of "comprise one . . . " do not exclude there being additional identity elements in the procedure, method, product or equipment of the elements.

The above embodiments are merely exemplary ones adopted for explaining the technical solutions of the present disclosure, rather than limiting the present disclosure. Although the present disclosure has been described in detail with reference to the foregoing embodiments, those of ordinary skill in the art should understand that various modifications may also be made to the technical solutions recorded in the preceding embodiments, or parts of the technical features thereof may be replaced by equivalents, and essence of the corresponding technical solutions with these modifications or replacements still falls into the spirit and scope of the embodiments of the present disclosure.

The present application claims priority of Chinese Patent Application No. 201510169597.7 filed on Apr. 10, 2015, the disclosure of which is incorporated in entirety herein by reference as a portion of the present application,

What is claimed is:

1. A shift register unit, comprising an input terminal, an output terminal, a reset terminal and a first noise leak terminal, the shift register unit further comprising:
   an input module connected to the input terminal and a first node, and configured to pull up a voltage at the first node under control of a signal received at the input terminal;
   an output module connected to the output terminal and the first node, and configured to pull up a voltage at the output terminal by using a first clock signal under control of the voltage at the first node;
   a reset module connected to the reset terminal and the first node, and configured to pull down the voltage at the first node under control of a signal received at the reset terminal;
   an output pull-down module connected to the output terminal, and configured to pull down the voltage at the output terminal under control of a second clock signal; and
   a first noise leak module connected to the first noise leak terminal and the first node, and configured to release a noise voltage at the first node to the first noise leak terminal under control of a third clock signal;
   wherein the first noise leak module is further configured to disconnect an electrical connection between the first noise leak terminal and the first node during a time period in which the voltage at the first node is pulled up;
   the shift register unit further comprises:
   a second noise leak terminal; and
   a second noise leak module connected to the second noise leak terminal, the first node and a clock signal terminal and configured to release a noise voltage at the first node to the second noise leak terminal under control of a fourth clock signal received at the clock signal terminal.

2. The shift register unit according to claim 1, wherein the first noise leak module comprises a first transistor, a gate of the first transistor being connected to the third clock signal, one of a source and a drain of the first transistor being connected to the first noise leak terminal, and the other of the source of and the drain of the first transistor being connected to the first node; and
   during at least a part of the time period in which the voltage at the first node is pulled up, a voltage of a signal received at the first noise leak terminal is greater than or equal to a voltage of the third clock signal.

3. The shift register unit according to claim 1,
   wherein the second noise leak module is further configured to disconnect an electrical connection between the second noise leak terminal and the first node during a time period in which the voltage at the first node is pulled up.

4. The shift register unit according to claim 3, wherein the second noise leak module comprises a second transistor, a gate of the second transistor being connected to the fourth clock signal, one of a source and a drain of the second transistor being connected to the second noise leak terminal, and the other of the source and the drain of the second transistor being connected to the first node; and
   during at least a part of the time period in which the voltage at the first node is pulled up, a voltage of a signal received at the second noise leak terminal is greater than or equal to a voltage of the fourth clock signal.

5. The shift register unit according to claim 4, wherein phases of the third clock signal, the first clock signal, the fourth clock signal and the second clock signal lag sequentially within a single clock cycle of the shift register unit.

6. The shift register unit according to claim 1, wherein the output module comprises:
   a first capacitor, a first terminal thereof being connected to the first node; and
   a third transistor, a gate thereof being connected to the first node, one of a source and a drain thereof being connected to the first clock signal, and the other of the source and the drain thereof being connected to the output terminal.

7. The shift register unit according to claim 1, wherein the output pull-down module comprises a fourth transistor, a gate of the fourth transistor being connected to the second clock signal, one of a source and a drain of the fourth transistor being connected to the output terminal, and the other of the source and the drain of the fourth transistor being connected to a low level voltage line.

8. The shift register unit according to claim 1, wherein the input module comprises a fifth transistor, a gate of the fifth transistor being connected to the input terminal, one of a source and a drain of the fifth transistor being connected to a high level voltage line, and the other of the source and the drain of the fifth transistor being connected to the first node.

9. The shift register unit according to claim 1, wherein the reset module comprises a sixth transistor, a gate of the sixth transistor being connected to the reset terminal, one of a source and a drain of the sixth transistor being connected to the first node, and the other of the source and the drain of the sixth transistor being connected to a low level voltage line.

10. A driving method for a shift register unit, wherein the shift register unit comprises an input terminal, an output terminal, a reset terminal, a first noise leak terminal, a second noise leak terminal, and a first node located inside the shift register unit, the driving method comprises:
   pulling up a voltage at the first node under control of a signal received at the input terminal;
   pulling up a voltage at the output terminal by using a first clock signal under control of a voltage at the first node, and disconnecting an electrical connection between the first noise leak terminal and the first node during a time period in which the voltage at the first node is pulled up;
   pulling down the voltage at the first node under control a signal received at the reset terminal, and pulling down the voltage at the output terminal under control of a second clock signal;
   releasing a noise voltage at the first node to the first noise leak terminal under control of a third clock signal; and
   releasing the noise voltage at the first node to the second noise leak terminal under control of a fourth clock signal.

11. A scan driving circuit comprising multiple stages of shift register units, wherein the shift register unit comprises:
   an input terminal;
   an output terminal;
   a reset terminal;
   a first noise leak terminal;
   an input module connected to the input terminal and a first node, and configured to pull up a voltage at the first node under control of a signal received at the input terminal;
   an output module connected to the output terminal and the first node, and configured to pull up a voltage at the output terminal by using a first clock signal under control of the voltage at the first node;
   a reset module connected to the reset terminal and the first node, and configured to pull down the voltage at the first node under control of a signal received at the reset terminal;
   an output pull-down module connected to the output terminal, and configured to pull down the voltage at the output terminal under control of a second clock signal; and
   a first noise leak module connected to the first noise leak terminal and the first node, and configured to release a noise voltage at the first node to the first noise leak terminal under control of a third clock signal, and further configured to disconnect an electrical connection between the first noise leak terminal and the first node during a time period in which the voltage at the first node is pulled up;
   wherein an input terminal of the shift register unit at an N-th stage is connected to an output terminal of the shift register unit at an (N−2)-th stage, a first noise leak terminal of the shift register unit at the N-th stage is connected to an output terminal of the shift register unit at the (N−1)-th stage, and a reset terminal of the shift register unit at the N-th stage is connected to an output terminal of the shift register unit at the (N+2)-th stage, the N being greater than or equal to 3;
   the shift register unit further comprises:
   a second noise leak terminal; and
   a second noise leak module connected to the second noise leak terminal, the first node and a clock signal terminal and configured to release a noise voltage at the first node to the second noise leak terminal under control of a fourth clock signal received at the clock signal terminal.

12. The scan driving circuit according to claim 11, wherein the second noise leak terminal of the shift register unit at the N-th stage is connected to an output terminal of the shift register unit at the (N+1)-th stage.

13. A display device comprising a scan driving circuit according to claim 11.

14. The shift register unit according to claim 2, wherein the output module comprises:
   a first capacitor, a first terminal thereof being connected to the first node; and
   a third transistor, a gate thereof being connected to the first node, one of a source and a drain thereof being connected to the first clock signal, and the other of the source and the drain thereof being connected to the output terminal.

15. The shift register unit according to claim 2, wherein the output pull-down module comprises a fourth transistor, a gate of the fourth transistor being connected to the second clock signal, one of a source and a drain of the fourth transistor being connected to the output terminal, and the other of the source and the drain of the fourth transistor being connected to a low level voltage line.

16. The shift register unit according to claim 2, wherein the input module comprises a fifth transistor, a gate of the fifth transistor being connected to the input terminal, one of a source and a drain of the fifth transistor being connected to a high level voltage line, and the other of the source and the drain of the fifth transistor being connected to the first node.

17. The shift register unit according to claim 2, wherein the reset module comprises a sixth transistor, a gate of the sixth transistor being connected to the reset terminal, one of a source and a drain of the sixth transistor being connected to the first node, and the other of the source and the drain of the sixth transistor being connected to a low level voltage line.

18. The scan driving circuit according to claim 11, wherein
the first noise leak module comprises a first transistor, a gate of the first transistor being connected to the third clock signal, one of a source and a drain of the first transistor being connected to the first noise leak terminal, and the other of the source of and the drain of the first transistor being connected to the first node; and
during at least a part of the time period in which the voltage at the first node is pulled up, a voltage of a signal received at the first noise leak terminal is greater than or equal to a voltage of the third clock signal.

19. The scan driving circuit according to claim 18, wherein the second noise leak terminal of the shift register unit at the N-th stage is connected to an output terminal of the shift register unit at the (N+1)-th stage.

20. The display device according to claim 13, wherein the second noise leak terminal of the shift register unit at the N-th stage is connected to an output terminal of the shift register unit at the (N+1)-th stage.

\* \* \* \* \*